(12) United States Patent
Bormann et al.

(10) Patent No.: US 11,579,181 B2
(45) Date of Patent: Feb. 14, 2023

(54) DETECTION OF A PARTIAL DISCHARGE

(71) Applicant: SIEMENS AKTIENGESELLSCHAFT, Munich (DE)

(72) Inventors: Ulf Bormann, Altdorf (DE); Martin Meyer, Nuremberg (DE); Dirk Scheibner, Nuremberg (DE); Jürgen Schimmer, Nuremberg (DE); Hermann-Josef Wiegand, Rasdorf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 17/761,837

(22) PCT Filed: Aug. 17, 2020

(86) PCT No.: PCT/EP2020/072944
§ 371 (c)(1),
(2) Date: Mar. 18, 2022

(87) PCT Pub. No.: WO2021/052692
PCT Pub. Date: Mar. 25, 2021

(65) Prior Publication Data
US 2022/0326293 A1 Oct. 13, 2022

(30) Foreign Application Priority Data
Sep. 19, 2019 (EP) ..................................... 19198375

(51) Int. Cl.
*G01R 31/12* (2020.01)
*G01R 31/34* (2020.01)
(52) U.S. Cl.
CPC .............................. *G01R 31/1272* (2013.01)

(58) Field of Classification Search
CPC .... G01R 31/34; G01R 31/343; G01R 31/346; G01R 31/12; G01R 31/1272
See application file for complete search history.

(56) References Cited

U.S. PATENT DOCUMENTS

| 5,814,998 | A | 9/1998 | Gruenewald et al. |
| 7,676,333 | B2 * | 3/2010 | Younsi ............... G01R 31/1227 324/458 |

(Continued)

FOREIGN PATENT DOCUMENTS

EP 0805355 A3 4/1999

OTHER PUBLICATIONS

PCT International Examination Report and Written Opinion of International Examination Authority dated Oct. 29, 2020 corresponding to PCT International Application No. PCT/EP2020/072944 filed Aug. 17, 2020.

*Primary Examiner* — Son T Le
(74) *Attorney, Agent, or Firm* — Henry M. Feiereisen LLC

(57) ABSTRACT

With a method and a device for detecting a partial discharge at a winding of an electrical machine, electromagnetic first measuring signals are detected in a partial discharge frequency range and electromagnetic second measuring signals are detected in an interference frequency range. A time window around a first measuring signal is predefined, and an identification criterion is defined for a partial discharge signal and an interference signal criterion is defined for a second measuring signal. A determination is made as to a partial discharge when a first measuring signal is detected that meets the identification criterion and when, in the time window around the first measuring signal, no second measuring signal that meets the interference signal criterion is detected. A quality of the detected partial discharge is (Continued)

assessed based on a characteristic value of the second measuring signal.

16 Claims, 3 Drawing Sheets

(56) References Cited

U.S. PATENT DOCUMENTS

| | | |
|---|---|---|
| 2002/0014890 A1 | 2/2002 | Cooke |
| 2007/0057677 A1 | 3/2007 | Koch et al. |
| 2017/0038424 A1* | 2/2017 | Ikegami ............. G01R 31/1272 |
| 2017/0074920 A1 | 3/2017 | DiStefano et al. |
| 2017/0192048 A1* | 7/2017 | Sako ................. G01R 31/1272 |
| 2018/0120380 A1 | 5/2018 | Giussani et al. |

* cited by examiner

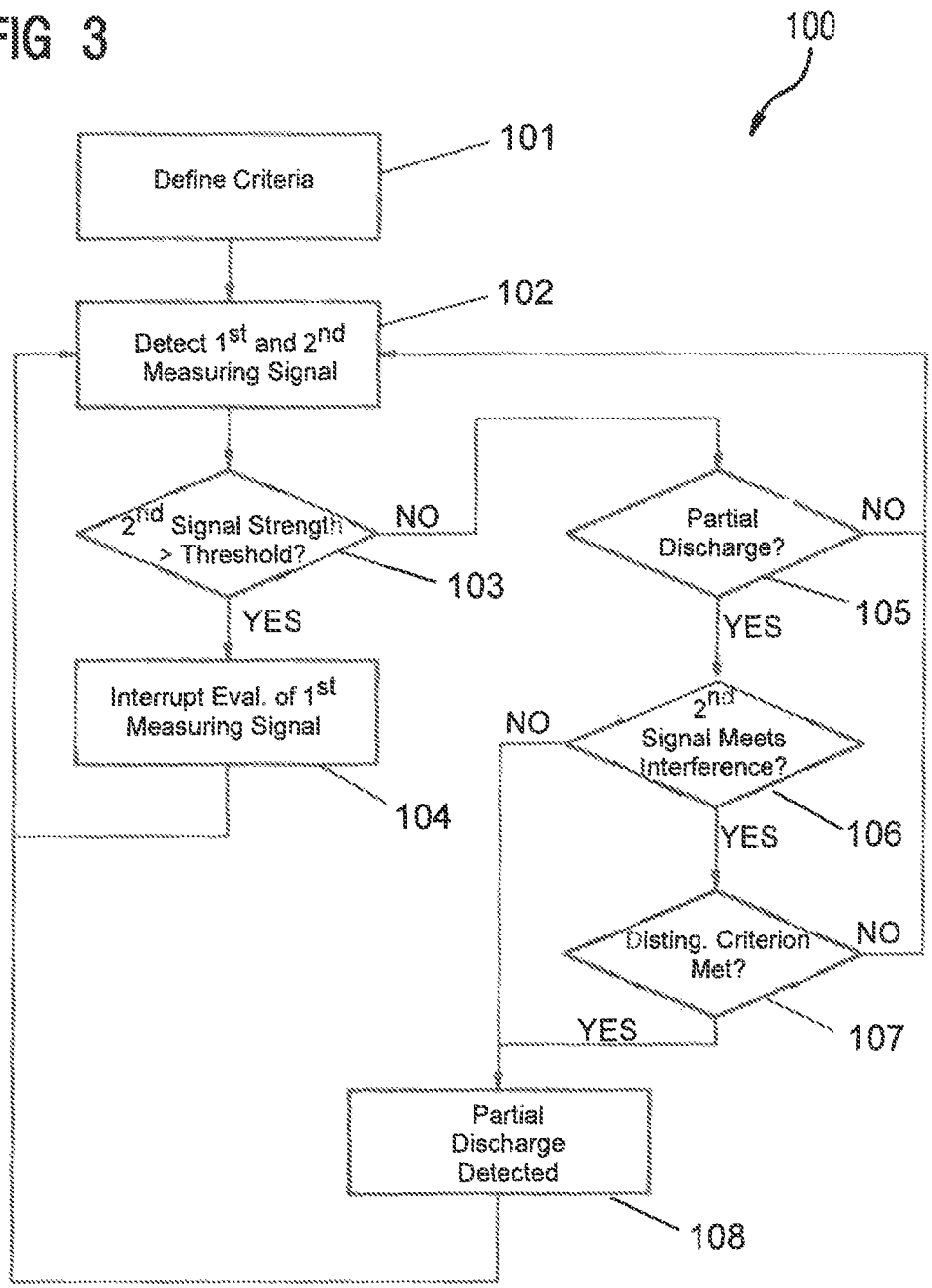

DETECTION OF A PARTIAL DISCHARGE

CROSS-REFERENCES TO RELATED APPLICATIONS

This application is the U.S. National Stage of International Application No. PCT/EP2020/072944, filed Aug. 17, 2020, which designated the United States and has been published as International Publication No. WO 2021/052692 A1 and which claims the priority of European Patent Application, Ser. No. 19198375.8, filed Sep. 19, 2019, pursuant to 35 U.S.C. 119(a)-(d).

BACKGROUND OF THE INVENTION

The invention relates to the detection of partial discharges at a winding of an electrical machine.

Partial discharges are local electrical discharges caused, for example, in local inhomogeneities of the insulation material, for example in small air pockets within the insulation of an electrical conductor as the result of strong inhomogeneities of an electrical field. Partial discharges can damage insulation locally and lead to the failure of the insulation in the long term. For this reason, electrical machines in particular are regularly inspected for partial discharges. Partial discharges cause short electromagnetic pulses with a typical duration of less than 1 µs and frequency components far into the UHF frequency range. Partial discharge signals are usually sought in frequency ranges between approximately 100 kHz and 10 MHz where partial discharge pulses are generally strongest.

There are numerous measuring methods for the detection of partial discharges, some of which are standardized, for example in accordance with DIN EN 60270. Electrical machines are almost exclusively subjected to offline measurements during which the regular operation of the electrical machine is interrupted; this incurs high costs, for example, due to interruptions in operation and the costs of the measuring equipment. Therefore, such measurements can only be performed occasionally.

With offline measurements, the measuring setup can be performed in a defined environment and external interference can often (but not always) be largely ruled out. On the other hand, in the case of online measurements during regular operation of an electrical machine, all operating components are active and can influence these measurements by coupling-in interference signals. If, for example, a rotating electrical machine is operated on a power converter, partial discharge pulses are superimposed by a large number of interference signals caused by the power converter's switching operations. Examples of possible further interference sources include radio services such as broadcasting, professional radio or mobile radio, non-specific sources of EMC interference, non-approved radio equipment, equipment operating in ISM bands (for example high-frequency welding equipment, laser equipment), remote-control keys, alarm systems and/or radio switches. The interference signals that can occur and the frequencies of these interference signals depend on the specific properties of the object in which partial discharges are to be detected (for example, components of a system consisting of a power converter and an electrical machine) and on interference sources present in the vicinity of the object.

In industrial plants, converters are frequently subject to interference from neighboring machines. This can constitute a permanent problem. Welding work in the vicinity can also be an interference source. However, in the case of repair work, this is only temporary interference, but, in the case of welding robots, it is also permanent interference. Interference signals are in particular pulse-like interference with a broad spectrum extending into the MHz or 100 MHz range. In this case, the frequency range depends upon the interference source.

Reliable detection of partial discharges requires such interference signals to be separated or distinguished from the partial discharge signals to ensure that partial discharge signals are not confused with interference signals.

The invention is based on the object of improving the detection of partial discharges at a winding of an electrical machine in particular with regard to distinguishing between partial discharge signals and interference signals.

SUMMARY OF THE INVENTION

The object is achieved according to the invention by a method and an apparatus as set forth hereinafter.

Advantageous embodiments of the invention are the subject matter of the subclaims.

The method according to the invention for detecting a partial discharge at a winding of an electrical machine detects first electromagnetic measuring signals in a partial discharge frequency range and second electromagnetic measuring signals in an interference frequency range. Further, a time window around a first measuring signal is predefined and an identification criterion for a partial discharge signal and an interference signal criterion for a second measuring signal are defined.

Partial discharges can occur at different locations, such as grooves or winding overhangs. The different types have different patterns in the phase-resolved partial discharge plot. In particular, the time window can be or is adapted to that which is expected.

PD pulses generally have a duration of approximately 100 ns to less than 5 µs. In one embodiment, the time window can be shorter than 5 µs before and after the pulse.

It is concluded that a partial discharge is present if a first measuring signal is detected that meets the identification criterion and no second measuring signal that meets the interference signal criterion is detected in the time window around the first measuring signal.

Therefore, according to the invention, in addition to electromagnetic measuring signals for detecting partial discharges, which are referred to here as first measuring signals, further electromagnetic measuring signals are detected, which are referred to here as second measuring signals and which are used to detect interference signals that could influence or even generate the first measuring signals.

In one embodiment, the second measuring signal can also be a signal that is not an electromagnetic signal. This can, for example, in the case of a neighboring motor, take place on the converter by measuring the structure-borne noise there and detecting the converter cycles via the structure-borne noise. However, in this case, the propagation time in the machine housing has to be taken into account. The structure-borne noise pulse arrives at the sensor much later than the electrical interference at the partial discharge sensor. In a further embodiment, for example, an actuation signal from the power semiconductors of the converter is used directly for noise blanking, i.e. as a second measuring signal, wherein this can again be an electrical or optical signal.

In order to identify first measuring signals as candidates for partial discharge signals, their detection is limited to a partial discharge frequency range typical of partial discharges and an identification criterion is defined that a first measuring signal must meet in order to be classified as a candidate for a partial discharge signal. The second measuring signals are detected in an interference frequency range relevant for interference signals that could influence or generate the first measuring signals.

Further, in particular an interference signal criterion is defined which characterizes a second measuring signal as a potentially relevant interference signal for the partial discharge detection. For the evaluation of the second measuring signals, a time window around a detected first measuring signal is predefined in which interference signals relevant for the partial discharge detection are sought if the first measuring signal is classified as a candidate for a partial discharge signal by means of the identification criterion. This takes account of the fact that a first measuring signal can only be influenced or generated by interference that occurs shortly before the detection of the first measuring signal (in particular a few µs), so that only interference signals that at least approximately coincide in time with the first measuring signal are relevant for the partial discharge detection.

In one embodiment, the size of the time window can be specified or changed. In this case, it is, for example, necessary to take account of the distance between the antennas, i.e. the influence of the signal propagation time in the propagation medium and the temporal tolerance of the pulse detection (Jitter). The time window should be selected larger than these factors.

In one embodiment, the beginning and/or end of the first measuring signal detected is specified via an amplitude threshold, wherein identification is possible by means of a comparator.

The time window takes into account, for example, time periods that elapse between the cause and the detection of a first measuring signal and/or a second measuring signal and/or are required for processing a first measuring signal and/or a second measuring signal. Therefore, according to the invention, it is concluded that a partial discharge is present if a first measuring signal is detected that is classified as a candidate for a partial discharge signal and no relevant interference signal is detected in the time window around this first measuring signal. The simultaneous evaluation of a first measuring signal and interference signals that can potentially influence and generate the first measuring signal advantageously increases the reliability of the identification of a partial discharge compared to an evaluation of only the first measuring signal. The influence in particular relates to the superimposition of signals.

One embodiment of the invention provides that the identification criterion comprises at least one feature of an amplitude signal for amplitudes of spectral components of a first measuring signal as a function of a frequency of the spectral components. For example, the amplitude signal is an envelope signal proportional to the course of logarithmic amplitudes of spectral components of output signals of the frequency filter. This embodiment of the invention advantageously simplifies the evaluation of a first measuring signal since partial discharge signals are high-frequency signals whose direct evaluation is complex and requires a high amount of computing power. Suitable features for defining the identification criterion are, for example, limits for a pulse duration and/or a level of the amplitude signal and/or a feature characterizing the signal shape of the amplitude signal (for example a limit for a ratio of the level to the pulse duration). Interference signals (for example from neighboring converters) frequently occur periodically and with a high repetition frequency.

Accordingly, a further embodiment of the invention provides that the interference signal criterion comprises at least one feature of an amplitude signal for amplitudes of spectral components of a second measuring signal as a function of a frequency of the spectral components.

The identification criterion used can, for example, be the repetition frequency. With good insulation of from <100 pulses/s up to damaged insulation of >100K pulses/s, the bandwidth of the PD Rate can be large. Strict periodicity is a feature indicative of a source of interference. This can be identified by statistical features. An evaluation of the distribution of the time interval between adjacent pulses can also be used as a criterion. Furthermore, in particular in the case of a suspected interference frequency, it is possible to take account of not only direct pulses but also of a plurality of adjacent pulses and a spectral evaluation and/or an autocorrelation, in the identification criterion.

In a further embodiment of the invention, a check is performed as to whether second measuring signals form a signal sequence of regularly repeating signals, for example at equal time intervals, of the same type and the interference signal criterion comprises the affiliation of a second measuring signal to a signal sequence of this type. This embodiment of the invention takes account of the fact that interference signals are frequently generated periodically, while partial discharge signals are generally randomly distributed.

In a further embodiment of the invention, the partial discharge frequency range and the interference frequency range have a non-empty intersection. This advantageously in particular takes into account second measuring signals with frequencies in the partial discharge frequency range, which are therefore potentially relevant for the partial discharge detection.

In one embodiment, if interference signals occur periodically and/or have a specific pattern, AI can be used to identify the signals. For example, it is possible to derive features from the statistical evaluation of the temporal sequence that enable classification of the pulses into PD (partial discharge) and interference. It is in particular possible to use a type of PLL that logs onto the interference signal. If certain sources of interference have characteristic pulse patterns, these can be detected by pattern recognition.

In a further embodiment of the invention, at least one subset of the first measuring signals is detected in or on the insulation of the winding of the electrical machine. This embodiment of the invention advantageously enables detection of first measuring signals in the vicinity of the origin of the partial discharges to be detected and thereby improves the measuring sensitivity of the partial discharge detection. In addition, the influences of interference signals on the first measuring signals are reduced since interference signals are generally generated outside the electrical machine.

In a further embodiment of the invention, at least one subset of the second measuring signals is detected outside the electrical machine, in particular in the vicinity of an interference source that could potentially generate second measuring signals. As already mentioned, interference signals are generally generated outside the electrical machine. Therefore, detection of second measuring signals outside the electrical machine, in particular in the vicinity of potential interference sources, is advantageous for achieving high measuring sensitivity in the detection of interference signals. In particular, it can be provided that potential interference sources are determined in advance, located and eliminated as far as possible and second measuring signals are selectively detected in the vicinity of located interference sources that cannot be eliminated.

The location of the detection of interference signals or partial discharge signals can play a role. The power converter is a potential source. Therefore, it is in particular favorable to arrange sensors for measuring the signals close to the power converter and/or on the machine supplied by the power converter. Here, 'close' in particular means in the region of the first 15% cable length of the cable on which the measurement is performed.

In a further embodiment of the invention, a distinguishing criterion for distinguishing a first measuring signal from a second measuring signal is defined. Further, in the event of a second measuring signal that meets the interference signal criterion being detected in the time window around a first measuring signal that meets the identification criterion, the first measuring signal is compared with the second measuring signal and it is only concluded that a partial discharge is present if the first measuring signal meets the distinguishing criterion. This embodiment of the invention is therefore aimed at a situation in which a second measuring signal, which is a potentially relevant interference signal for the partial discharge detection, is detected in the time window around a first measuring signal that is classified as a candidate for a partial discharge signal. The embodiment of the invention provides that, in such a case, the first and the second measuring signal are compared with one another in order to decide whether the first measuring signal is attributable to a partial discharge or to an interference source. To decide this, a distinguishing criterion for distinguishing a first measuring signal from a second measuring signal is defined and used.

A further embodiment of the aforementioned embodiment of the invention provides that the distinguishing criterion comprises at least one feature that distinguishes the amplitude signals for amplitudes of spectral components of a first measuring signal and a second measuring signal from one another as a function of a frequency of the spectral components. Another further embodiment provides that the distinguishing criterion comprises the absence of a periodic repetition of the first measuring signal that is characteristic of the second measuring signal. The first further embodiment provides that a first measuring signal and a second measuring signal are compared based on the comparison of amplitude signals formed therefrom. This has the aforementioned advantage that the amplitude signals are easier to evaluate than is the case with a direct evaluation of the measuring signals. The second further embodiment in turn makes use of the fact that interference signals are frequently generated periodically, while partial discharge signals are generally randomly distributed. It is therefore improbable that the first measuring signal is attributable to an interference signal if the second measuring signal is repeated periodically, while the first measuring signal is not repeated periodically.

In a further embodiment of the invention, the interference signal criterion comprises a threshold value for a signal strength of a second measuring signal and the evaluation of first measuring signals is interrupted if the signal strength of a second measuring signal exceeds the threshold value. According to this embodiment of the invention, the evaluation of first measuring signals is thus interrupted on the occurrence of very strong interference signals, since very strong interference signals make it probable that partial discharge signals are influenced and hence call into question the informative value of an evaluation of first measuring signals. In this case, the threshold value can preferably be changed and can hence in particular be adapted to changing circumstances and requirements of the partial discharge detection.

In a further embodiment of the invention, it can be provided that the detected second measuring signals are evaluated in order to search in a selective manner for the interference sources that influence the partial discharge measurements in order to eliminate them as far as possible. Further, it can be provided that the frequency and/or at least one further characteristic value of second measuring signals (for example, times of occurrence, signal strengths and/or signal durations of second measuring signals) are used to assess the quality or reliability of the partial discharge detection. For example, the greater the frequency and/or strength of second measuring signals that are temporally correlated with the first measuring signals, the poorer the classification of the quality of the partial discharge detection.

An apparatus according to the invention for detecting a partial discharge at a winding of an electrical machine according to the method according to the invention comprises two measuring arrangements and at least one evaluation unit. A first measuring arrangement is configured to detect the first electromagnetic measuring signals. The second measuring arrangement is configured to detect the second electromagnetic measuring signals. The at least one evaluation unit is configured to check whether a first measuring signal meets the identification criterion for a partial discharge signal and whether a second measuring signal that meets the interference signal criterion is detected in the predefined time window around a first measuring signal.

In one embodiment of the apparatus according to the invention, the first measuring arrangement has at least one first antenna arranged in or on the insulation of the winding of the electrical machine and, for each first antenna, a decoupling unit for decoupling signals detected by the first antenna.

In a further embodiment of the apparatus according to the invention, the second measuring arrangement has at least one second antenna arranged outside the electrical machine, in particular in the vicinity of an interference source that could potentially generate second measuring signals and, for each second antenna, has a decoupling unit for decoupling signals detected by the second antenna.

In particular, first and/or second measuring signals can be detected at different locations, for example with a plurality of antennas.

In a further embodiment of the apparatus according to the invention, the at least one evaluation unit is configured, in the event of a second measuring signal that meets the interference signal criterion being detected in the time window around a first measuring signal that meets the identification criterion, to compare the first measuring signal with the second measuring signal on the basis of a distinguishing criterion.

In a further embodiment of the apparatus according to the invention, the at least one evaluation unit is configured to interrupt the evaluation of first measuring signals if the signal strength of a second measuring signal exceeds a threshold value.

An apparatus according to the invention enables the method according to the invention to be performed with the advantages already mentioned above.

BRIEF DESCRIPTION OF THE DRAWING

The above-described properties, features and advantages of this invention and the manner in which these are achieved will become clearer and more plainly comprehensible in conjunction with the following description of exemplary embodiments explained in more detail in conjunction with the drawings. The drawings show:

FIG. 1 a block diagram of a first exemplary embodiment of an apparatus for detecting a partial discharge, FIG. 2 a block diagram of a second exemplary embodiment of an apparatus for detecting a partial discharge, FIG. 3 a flowchart of an exemplary embodiment of a method for

DETAILED DESCRIPTION OF PREFERRED EMBODIMENTS

In the figures, corresponding parts are given the same reference numbers.

Figure 1:
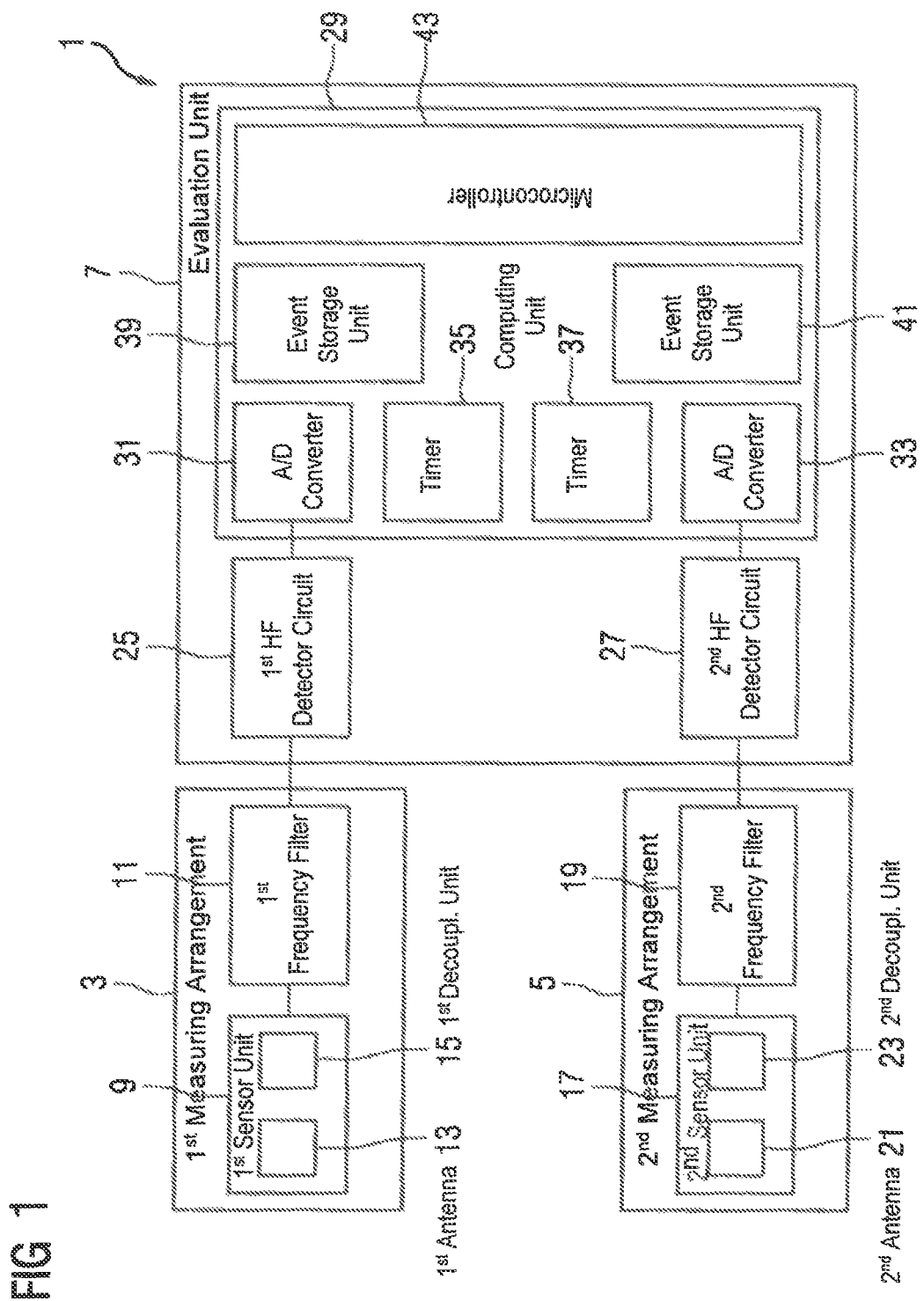

FIG. 1 shows a block diagram of a first exemplary embodiment of an apparatus 1 for detecting a partial discharge at a winding of an electrical machine. The apparatus 1 comprises two measuring arrangements 3, 5 and an evaluation unit 7.

A first measuring arrangement 3 is configured to detect first electromagnetic measuring signals in a partial discharge frequency range. For this purpose, the first measuring arrangement 3 has a first sensor unit 9 and a first frequency filter 11. The first sensor unit 9 has a first antenna 13 arranged in or on the insulation of the winding of the electrical machine and a first decoupling unit 15 for decoupling signals detected by the first antenna 13. The first antenna 13 is formed, for example, by leads of a first temperature sensor, which is configured to detect a temperature in the electrical machine and, for this purpose, has a temperature-dependent measuring resistor made, for example, of platinum, for example a platinum measuring resistor Pt100. Such temperature sensors are frequently used in electrical machines anyway and can thus advantageously also be used for partial discharge detection. Supply leads of the first antenna 13 are preferably shielded in order to reduce the coupling-in of interference signals. The first decoupling unit 15 is, for example, a diplexer for decoupling high-frequency signals from the first antenna 13 in order to separate these signals from low-frequency temperature signals detected by the first temperature sensor. The first frequency filter 11 is configured to filter the electrical signals decoupled by the first decoupling unit 15 and has a passband defining the partial discharge frequency range.

The second measuring arrangement 5 is configured to detect second electromagnetic measuring signals in an interference frequency range. For this purpose, the second measuring arrangement 5 has a second sensor unit 17 and a second frequency filter 19. The second sensor unit 17 has a second antenna 21 arranged outside the electrical machine and a second decoupling unit 23 for decoupling signals detected by the second antenna 21. The second antenna 21 is formed, for example, by leads of a second temperature sensor, which is configured to detect an ambient temperature in the environment of the electrical machine and, for this purpose, has a temperature-dependent measuring resistor made, for example, of platinum, for example a platinum measuring resistor Pt100. Supply leads of the second antenna 21 are preferably unshielded in order to receive as many interference signals as possible. The second decoupling unit 23 is for example a diplexer for decoupling high-frequency signals detected by the second antenna 21 in order to separate these signals from low-frequency temperature signals detected by the second temperature sensor. The second frequency filter 19 is configured to filter the electrical signals decoupled by the second decoupling unit 23 and has a passband defining the interference frequency range. The interference frequency range and the partial discharge frequency range have, for example, a non-empty intersection. In particular, the interference frequency range can completely encompass the partial discharge frequency range. Alternatively, however, the interference frequency range can also lie outside (but preferably in the vicinity of) the partial discharge frequency range, because, even if second measuring signals are then only detected outside the partial discharge frequency range, interference causing the second measuring signals can also cause interference signals with frequencies within the partial discharge frequency range. In any case, the interference frequency range uses more bandwidth than the partial discharge frequency range. Further, the partial discharge frequency range and/or the interference frequency range can have non-contiguous partial frequency ranges in order to detect partial discharges and/or interference signals in different frequency ranges.

In alternative exemplary embodiments of the apparatus 1, instead of an antenna 13, 21, the first sensor unit 9 and/or the second sensor unit 17 have another sensor for detecting electromagnetic signals, for example a capacitive coupling apparatus with at least one coupling capacitor, an inductive coupling apparatus with at least one coupling coil, or a directional coupler.

The evaluation unit 7 has two high-frequency detector circuits 25, 27 and a computing unit 29. A first detector circuit 25 is configured to determine first amplitude signals for amplitudes of spectral components of the first measuring signals as a function of a frequency of the spectral components from the first measuring signals output by the first frequency filter 11. The second detector circuit 27 is configured to determine second amplitude signals for amplitudes of spectral components of the second measuring signals as a function of a frequency of the spectral components from the second measuring signals output by the second frequency filter 19. For example, the amplitude signals determined by the detector circuits 25, 27 are in each case envelope signals proportional to logarithmic amplitudes of spectral components of the output signals of the respective frequency filter 11, 19.

The computing unit 29 comprises two analog-to-digital converters 31, 33, two timers 35, 37, two event storage units 39, 41 and a microcontroller 43.

A first analog-to-digital converter 31 digitizes the first amplitude signals output by the first detector circuit 25. The second analog-to-digital converter 33 digitizes the second amplitude signals output by the second detector circuit 27.

A first timer 35 determines the times of detection of first measuring signals and the respective signal duration of a first measuring signal. The second timer 37 determines the times of detection of second measuring signals and the respective signal duration of a second measuring signal. Instead of two timers 35, 37, it is alternatively also possible to use a mufti-channel timer, wherein the first and second measuring signals are assigned to different channels of the timer.

A first event storage unit 39 stores the first amplitude signals digitized by the first analog-to-digital converter 31 and the associated times and signal durations detected by the first timer 35. The second event storage unit 41 stores the second amplitude signals digitized by the second analog-to-digital converter 33 and the associated times and signal durations detected by the second timer 37.

The amplitude signals digitized by the detector circuits 25, 27 are evaluated by the microcontroller 43. In particular, the microcontroller 43 checks whether the digitized first amplitude signal of a first measuring signal meets a predefined identification criterion for a partial discharge signal and whether a second measuring signal with a digitized second amplitude signal that meets a predefined interference signal criterion is detected in a predefined time window around a first measuring signal. Further, the microcontroller 43 is configured to compare the digitized amplitude signals of a first measuring signal and a second measuring signal with one another if the second measuring signal is detected in the predefined time window around the first measuring signal, the digitized first amplitude signal of the first measuring signal meets the identification criterion and the digitized second amplitude signal of the second measuring signal meets the interference signal criterion. Further aspects of the evaluation of the first and second measuring signals are described below with reference to an exemplary embodiment of a method according to the invention. Instead of a microcontroller 43, the computing unit 29 can, for example, have a FPGA (field programmable gate array) or another processing unit suitable for evaluating the digitized amplitude signals.

Figure 2:
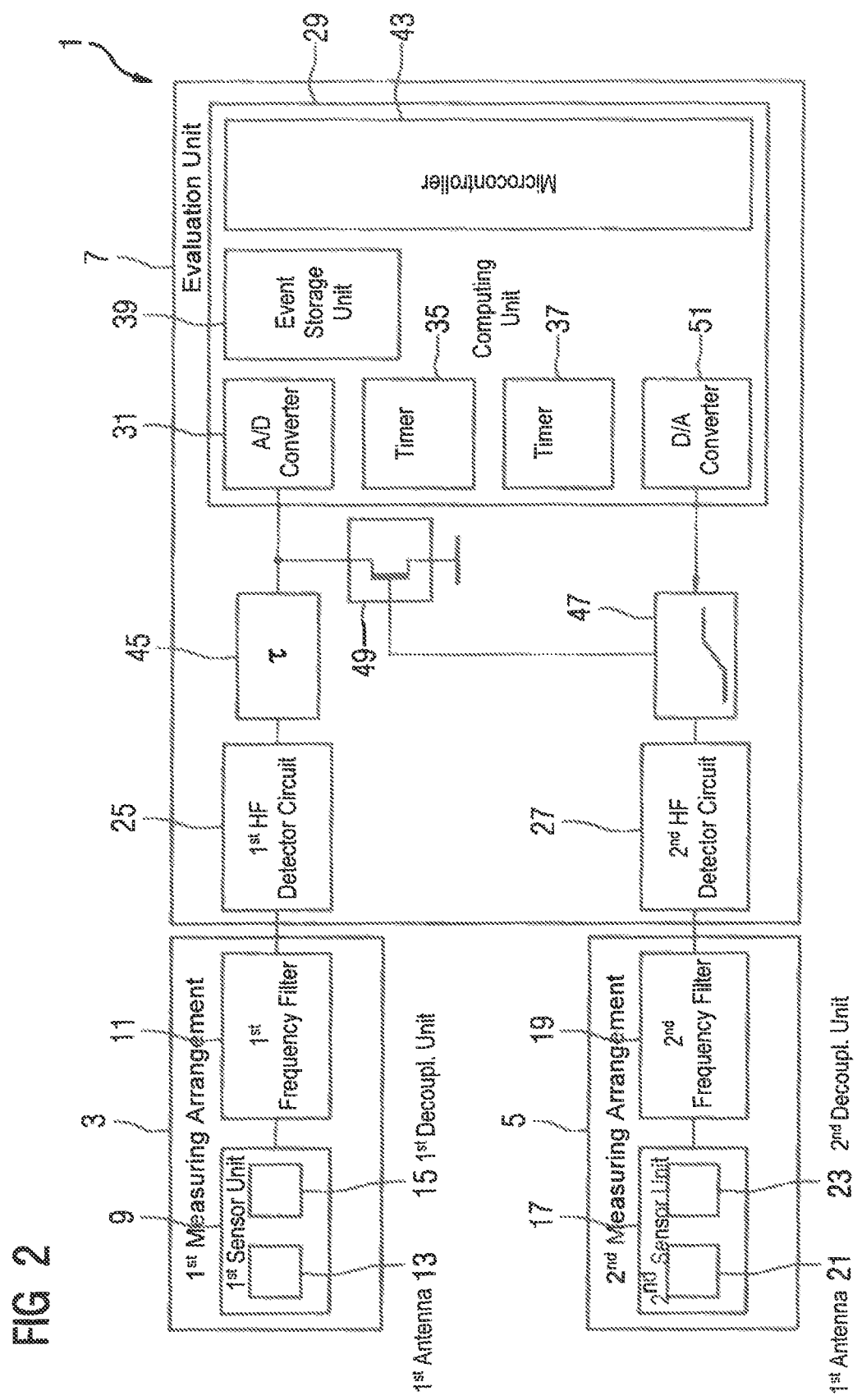

FIG. 2 shows a block diagram of a second exemplary embodiment of an apparatus 1 for detecting a partial discharge at a winding of an electrical machine. This exemplary embodiment differs from the exemplary embodiment shown in FIG. 1 in that the evaluation unit 7 additionally has a delay element 45, a threshold value detector 47 and a switching unit 49 and in that, instead of the second analog-to-digital converter 33 and the second event storage unit 41, the computing unit 29 has a digital-to-analog converter 51.

The delay element 45 is connected between the first detector circuit 25 and the analog-to-digital converter 31 and delays the forwarding of the first amplitude signals output by the first detector circuit 25 to the analog-to-digital converter 31 by a delay time T.

The digital-to-analog converter 51 converts a threshold value for a signal strength of a second measuring signal, which is predefined as a digital signal, into an analog threshold value signal and outputs this threshold value signal to the threshold value detector 47. The threshold value detector 47 compares the second amplitude signal of a second measuring signal output by the second detector circuit 27 with the threshold value signal. If the second amplitude signal exceeds the threshold value signal, the threshold value detector 47 activates the switching unit 49, which then interrupts the output of first amplitude signals by the delay element 45 to the computing unit 29 by connecting the output of the delay element 45 to a ground potential. In this case, the delay time T takes into account different signal propagation times and processing times for the first and second measuring signals, in particular also the time required by the threshold value detector 47 to compare the second amplitude signal with the threshold value signal and the switching time required to activate the switching unit 49.

The threshold value can, for example, be changed via the microcontroller 43, and thus adapted to changing circumstances and requirements. This enables the sensitivity of the apparatus 1 to interference signal strengths to be varied flexibly. The threshold value can in particular also be used to switch off the suppression of interference signals, for example by setting a very high threshold value.

To interrupt the evaluation of the first measuring signals by activating the switching unit 49, for example, an interruption time is predefined after which the switching unit 49 is deactivated again or the evaluation of the first measuring signals is continued by deactivating the switching unit 49 as soon as the second amplitude signal falls back below the threshold value signal or after a predefined time has elapsed after the second amplitude signal has fallen below the threshold value signal.

In the exemplary embodiment shown in FIG. 2, the microcontroller 43 only evaluates the first amplitude signals of the first measuring signals by checking each time whether the first amplitude signal of a first measuring signal meets the predefined identification criterion.

The exemplary embodiments shown in FIGS. 1 and 2 can also be combined, for example, by expanding the first exemplary embodiment shown in FIG. 1 by a delay element 45, a threshold value detector 47, a switching unit 49 and a digital-to-analog converter 51 similarly to the second exemplary embodiment shown in FIG. 2. As in the second exemplary embodiment, the evaluation of the first amplitude signals is interrupted by activating the switching unit 49 if the second amplitude signal exceeds the threshold value signal, but the first and second amplitude signals are processed by the analog-to-digital converters 31, 33 as in the first exemplary embodiment and evaluated by the microcontroller 43 when the switching unit 49 is deactivated, i.e. when the second amplitude signal is below the threshold value signal.

FIG. 3 shows a flowchart 100 of an exemplary embodiment of the method according to the invention for detecting a partial discharge with method steps 101 to 108.

In a first method step 101, an identification criterion for a partial discharge signal, an interference signal criterion for a second measuring signal and a distinguishing criterion for distinguishing a first measuring signal from a second measuring signal are defined.

The identification criterion comprises, for example, at least one feature of a first amplitude signal for amplitudes of spectral components of a first measuring signal as a function of a frequency of the spectral components. Such features are, for example, limits for a pulse duration and/or a level of the first amplitude signal and/or a feature characterizing the signal shape (for example a limit for a ratio of a level to a pulse duration).

The interference signal criterion comprises a threshold value for a signal strength of a second measuring signal. Further, the interference signal criterion can comprise at least one feature of a second amplitude signal for amplitudes of spectral components of a second measuring signal as a function of a frequency of the spectral components. Similarly to the identification criterion, such features are for example, a feature characterizing the signal shape and/or limits for a pulse duration and/or a level of the second amplitude signal. Furthermore, it can be checked whether second measuring signals form a signal sequence of regularly repeating signals of the same type, in particular signals of the same type following one another at equal time intervals and the interference signal criterion can comprise the affiliation of a second measuring signal to a signal sequence of this type.

The distinguishing criterion comprises for example at least one feature that distinguishes the amplitude signals for amplitudes of spectral components of a first measuring signal and a second measuring signal as a function of a frequency of the spectral components from one another. Alternatively or additionally, the distinguishing criterion can comprise the absence of a periodic repetition of the first measuring signal that is characteristic of the second measuring signal. A second method step 102 is carried out after the first method step 101.

In the second method step 102, an electromagnetic first measuring signal is detected in a partial discharge frequency range and an electromagnetic second measuring signal is detected in a predefined time window around the first measuring signal in an interference frequency range. A third method step 103 is carried out after the second method step 102.

In the third method step 103 a check is performed as to whether the signal strength of the second measuring signal detected in the second method step 102 exceeds the threshold value. If this is the case, a fourth method step 104 is carried out after the third method step 103. Otherwise, a fifth method step 105 is carried out after the third method step 103.

In the fourth method step 104, the evaluation of first measuring signals is interrupted, for example for a predefined interruption time or until the signal strength of the second measuring signal falls below the threshold value. The second method step 102 is repeated after the fourth method step 104.

In the fifth method step 105, a check is performed as to whether the first measuring signal detected in the second method step 102 meets the identification criterion for a partial discharge signal. If this is the case, a sixth method step 106 is carried out after the fifth method step 105. Otherwise, the second method step 102 is repeated after the fifth method step 105.

In the sixth method step 106, a check is performed as to whether the second measuring signal detected in the second method step 102 meets the interference signal criterion, provided that the interference signal criterion has at least one feature for a second measuring signal that is alternative to the threshold value. If the interference signal criterion does not have a feature alternative to the threshold value or the second measuring signal meets a feature alternative to the threshold value, a seventh method step 107 is carried out after the sixth method step 106. Otherwise, an eighth method step 108 is carried out after the sixth method step 106.

In the seventh method step 107, a check is performed as to whether the distinguishing criterion between the first measuring signal detected in the second method step 102 and the second measuring signal detected in the second method step 102 has been met. If this is the case, the eighth method step 108 is carried out after the seventh method step 107. Otherwise, the second method step 102 is repeated after the seventh method step 107.

In the eighth method step 108, it is concluded that a partial discharge is present. Further, the value of a counting variable for identified partial discharges, which is, for example, created in the computing unit 29, is preferably incremented by one and the time of the partial discharge is stored. The second method step 102 is repeated after the eighth method step 108.

Although the invention has been illustrated and described in greater detail by preferred exemplary embodiments, the invention is not restricted by the disclosed examples and other variations can be derived herefrom by the person skilled in the art without departing from the scope of protection of the invention.

What is claimed is:

1. A method for detecting a partial discharge at a winding of an electrical machine, comprising:
   detecting a first electromagnetic measuring signal in a partial discharge frequency range;
   detecting a second electromagnetic measuring signal in an interference frequency range;
   predefining a time window around the first electromagnetic measuring signal;
   defining an identification criterion for a partial discharge signal;
   defining an interference signal criterion for the second electromagnetic measuring signal;
   concluding that a partial discharge takes place when the first detected electromagnetic measuring signal meets the identification criterion and when no second electromagnetic measuring signal that meets the interference signal criterion is detected in the time window around the first electromagnetic measuring signal; and
   assessing a quality of the detected partial discharge based on a characteristic value of the second measuring signal, wherein the quality of the detected partial discharge decreases with increasing at least one of a frequency and a strength of the second measuring signal that is temporally correlated with the first measuring signal.

2. The method of claim 1, wherein the identification criterion comprises at least one feature of an amplitude signal for amplitudes of spectral components of the first electromagnetic measuring signal as a function of a frequency of the spectral components, and wherein the interference signal criterion comprises at least one feature of an amplitude signal for amplitudes of spectral components of a second electromagnetic measuring signal as a function of a frequency of the spectral components.

3. The method of claim 1, further comprising checking whether the second electromagnetic measuring signals is comprised of a signal sequence of regularly repeating signals of the same type, and whether the interference signal criterion indicates that the second electromagnetic measuring signal is associated with the signal sequence of this same type.

4. The method of claim 1, wherein the partial discharge frequency range and the interference frequency range have a non-empty intersection.

5. The method of claim 1, wherein at least one subset of the first electromagnetic measuring signals is detected in or on the insulation of the winding of the electrical machine.

6. The method of claim 1, wherein at least one subset of the second electromagnetic measuring signals is detected outside the electrical machine, in particular proximate to an interference source capable of generating second electromagnetic measuring signals.

7. The method of claim 1, further comprising:
   defining a distinguishing criterion for distinguishing the first electromagnetic measuring signal from the second electromagnetic measuring signal;
   when detecting in the time window around a first electromagnetic measuring signal that meets the identification criterion a second electromagnetic measuring signal that meets the interference signal criterion, comparing the electromagnetic first measuring signal with the second electromagnetic measuring signal; and
   concluding that a partial discharge has occurred only when the first electromagnetic measuring signal meets the distinguishing criterion.

8. The method of claim 7, wherein the distinguishing criterion comprises a feature that distinguishes amplitude signals of amplitudes of spectral components of the first electromagnetic measuring signal and of the second electromagnetic measuring signal from one another as a function of a frequency of the spectral components.

9. The method of claim 7, wherein the distinguishing criterion comprises an absence of a periodic repetition of the first electromagnetic measuring signal, with the periodic repetition being a characteristic of the second electromagnetic measuring signal.

10. The method of claim 1, wherein the interference signal criterion comprises a threshold value for a signal strength of a second electromagnetic measuring signal, and wherein evaluation of first electromagnetic measuring signals is interrupted when the signal strength of a second electromagnetic measuring signal exceeds the threshold value.

11. An apparatus for detecting a partial discharge at a winding of an electrical machine, comprising:
   a first measuring arrangement detecting a first electromagnetic measuring signal in a partial discharge frequency range;
   a second measuring arrangement detecting a second electromagnetic measuring signal in an interference frequency range; and
   an evaluation unit configured to
      receive the first electromagnetic measuring signal and the second electromagnetic measuring signal,
      check whether the first electromagnetic measuring signal meets a predefined identification criterion for a partial discharge signal, and whether the second electromagnetic measuring signal that meets an interference signal criterion is detected in a predefined time window around a first electromagnetic measuring signal,
      conclude that the partial discharge has occurred, when detecting the first electromagnetic measuring signal that meets the identification criterion, while not detecting the second electromagnetic measuring signal that meets the interference signal criterion in the predefined time window around the first electromagnetic measuring signal, and
      assess a quality of the detected partial discharge based on a characteristic value of the second electromagnetic measuring signal, wherein the quality of the detected partial discharge decreases with increasing at least one of a frequency and a strength of the second electromagnetic measuring signals that is temporally correlated with the first electromagnetic measuring signal.

12. The apparatus of claim 11, wherein the first measuring arrangement comprises a first antenna arranged in or on an insulation of the winding of the electrical machine, and a first decoupling unit configured to decouple signals detected by the first antenna.

13. The apparatus of claim 11, wherein the second measuring arrangement comprises a second antenna arranged outside the electrical machine, in particular proximate to an interference source capable of generating the second measuring signals, and a second decoupling unit configured to decouple signals detected by the second antenna.

14. The apparatus of claim 11, wherein the evaluation unit is configured to compare the first electromagnetic signal with the second electromagnetic measuring signal based on a distinguishing criterion, when a second electromagnetic measuring signal that meets the interference signal criterion is detected in the time window around a first electromagnetic measuring signal that meets the identification criterion.

15. The apparatus of claim 14, wherein the distinguishing criterion comprises a feature that distinguishes amplitude signals of amplitudes of spectral components of the first electromagnetic measuring signal and of the second electromagnetic measuring signal from one another as a function of a frequency of the spectral components.

16. The apparatus of claim 14, wherein the distinguishing criterion comprises an absence of a periodic repetition of the first electromagnetic measuring signal, with the periodic repetition being a characteristic of the second electromagnetic measuring signal.

* * * * *